(12) United States Patent
Gor et al.

(10) Patent No.: US 12,406,128 B2
(45) Date of Patent: Sep. 2, 2025

(54) AUTOMATION FOR FUNCTIONAL SAFETY DIAGNOSTIC COVERAGE

(71) Applicant: Synopsys, Inc., Mountain View, CA (US)

(72) Inventors: Mehulkumar Kantibhai Gor, Bengaluru (IN); Vishal Ramkrishna Shenvi, Bangalore (IN); Shekhar Sharan Bhatiya, Bangalore (IN)

(73) Assignee: Synopsys, Inc., Sunnyvale, CA (US)

( * ) Notice: Subject to any disclaimer, the term of this patent is extended or adjusted under 35 U.S.C. 154(b) by 693 days.

(21) Appl. No.: 17/744,610

(22) Filed: May 13, 2022

(65) Prior Publication Data

US 2022/0366120 A1 Nov. 17, 2022

Related U.S. Application Data

(60) Provisional application No. 63/189,596, filed on May 17, 2021.

(51) Int. Cl.
*G06F 30/398* (2020.01)
*G06F 11/00* (2006.01)

(52) U.S. Cl.
CPC .......... *G06F 30/398* (2020.01); *G06F 11/004* (2013.01)

(58) Field of Classification Search
CPC .... G06F 18/2178; G06F 18/217; G06F 18/21; G06F 18/25; G06F 17/18; G06F 16/2477; G06F 2218/00; G06F 18/20; G06F 2211/005; G06F 16/2379; G06F 16/24; G06F 16/245; G06F 11/004; G06F 18/213; G06F 21/6245; G06F 30/3323; G06F 30/398; G06F 30/394; G06F 9/4881; G06F 15/17362; G06F 11/1423; G06F 30/33; G06F 11/1428; G06F 30/31; G06F 30/327; G06F 30/3308; G06F 11/006; G06F 11/0712; G06F 11/1417; G06F 11/261; G05B 23/0294; G05B 2219/35001; G05B 2219/37337; G05B 19/042; G05B 19/41885; G05B 23/02
(Continued)

(56) References Cited

U.S. PATENT DOCUMENTS

2019/0370503 A1* 12/2019 Locatelli ................. G06F 21/75
2022/0100937 A1* 3/2022 Maamari ................. G06N 7/01

OTHER PUBLICATIONS

Viswanathan et al., white paper, "State of the Art Software Test Libraries (STL) and Asil B: Truths, Myths, and Guidance," downloaded Apr. 13, 2022, 15 pages.

* cited by examiner

*Primary Examiner* — Binh C Tat
(74) *Attorney, Agent, or Firm* — Korbin S Van Dyke; Haynes Beffel & Wolfeld LLP

(57) ABSTRACT

A method of implementing an automated technology for conducting functional safety (FuSa) diagnostic coverage is provided. The method can include receiving functional safety information that includes failure modes defining wrong values of a signal indicating a factor manifesting an error, receiving an identification of internal safety protected signals and a diagnostic coverage for the FuSa block, performing back tracing of possible paths for an output port of a FuSa block for each failure mode of each safety protected signal, determining an area for each possible path, and determining, based on a diagnostic coverage and area calculated for each of the paths, a diagnostic coverage for each failure mode of the FuSa block.

20 Claims, 12 Drawing Sheets

(58) Field of Classification Search
USPC .................................................. 716/136–139
See application file for complete search history.

Continued from FIG. 2A

User to provides protected signals' (ps) hierarchical paths
(e.g. Ps*1* to Ps*k*) in FIG. 3B.

Based on given input, automation will categorize
logic cone's possible internal path in terms of following:

i.   In – Input port
    ii.   Ep – unprotected internal endpoint signal
    iii.   Ps – safety protected internal signal, on
           which safety mechanism is placed (user input)
    iv.   Out – Output port Out(f) logic cone area = Sum of possible internal paths.

Continued from FIG. 3A

Automation will figure out possible internal paths' area by back tracing netlist. Such as:

- InOut - *Input to output Path, where no safety protected signals are present*
- EpOut– *Endpoint to output path, where no safety protected signals are present*
- InPs – *Input to safety protected signal path*
- EpPs – *Endpoint to safety protected signal path*
- PsOut- *Safety protected signal to output path*

And sum all possible internal paths' area to get total logic cone area.

Out1 Logic ConeArea =

$$\sum_{f=1}^{f=i} In(f)Out1Area + \sum_{f=1}^{f=j} Ep0.(f)Out1Area +$$

$$\sum_{g=1}^{g=k} \left( \sum_{f=1}^{f=i} (In(f)Ps(g)Area) + \left( \sum_{f=1}^{f=j} (Ep(g).(f)Ps(g)Area) + Ps(g)Out1Area \right) \right)$$

Continued from FIG.4A 

To get safety protected area (SPA) for each internal path, additionally user provides diagnostic capability (DC) for following:

(i) All protected signals' (ps) diagnostic capability according to ISO26262 standard. User can optionally, provide a diagnostic label.
(ii) IP top-level input ports' diagnostic capability a corresponding label, if known.

Internal input ports' diagnostic capability can get inferred by automation from a connected driver.

Out1 logic cone SPA =

$$\sum_{f=1}^{f=i} In(f)Out1Area * In(f)DC + \sum_{f=1}^{f=j} Ep0.(f)Out1Area * 0 +$$

$$\sum_{g=1}^{g=k} \left( \sum_{f=1}^{f=i} (In(f)Ps(g)Area) * In(f)DC \right) +$$
$$\sum_{f=1}^{f=j} (Ep(g).(f) Ps(g)Area)*0 +$$
$$Ps(g)Out1Area * Ps(g)DC)$$

Continued from FIG. 5

Automation will next determine logic cone SPA and logic cOne Area for each output port. So, with these, diagnostic coverage (DC), $$\text{Out1 DC} = \frac{\textit{Out1 logic cone SPA}}{\textit{Out1 logic cone area}} \times 100\%$$

$$\text{FM1 DC} = \frac{\sum_{f=1}^{f=m} \textit{Out(f) logic cone SPA}}{\sum_{f=1}^{f=m} \textit{Out(f) logic cone area}} \times 100\%$$

Get diagnostic coverage and associated diagnostics' labels for each output & failure mode

FIG. 6A

Example1 - Tabular structure for user inputs and automation outputs

Single Table for DC information

| ps_table_header | signal | Width | hierarchical_path | diagnostic_label | diagnostic_coverage |
|---|---|---|---|---|---|
| ps_table_entry | InToP | 448 | | | |
| ps_table_entry | pPsA | | A_instC_inst | DI002DI002 | 0900 |
| ps_table_entry | PsC | | | | |

602

Per FuSa block Table for FM information

| out_table_header | signal | width | | | output_classification | diagnostic_label | diagnostic_coverage |
|---|---|---|---|---|---|---|---|
| out_table_fm_en | | | FM1 | FM2 | | | |
| out_table_entry | OutA | 4 | 1 | 0 | | | |
| fm_table_header | fm_label | fm_description | fm_effect | fm_area | fm_seq_area | permanant_fmd | transient_fmd | diagnostic_coverage |
| rfm_table_entry | FM1 | | | | | | | |

603

Per FuSa block Table with DC calculation

| out_table_header | signal | width | | | output_classification | diagnostic_label | diagnostic_coverage |
|---|---|---|---|---|---|---|---|
| out_table_fm_en | | | FM1 | FM2 | | | |
| out_table_entry | OutA | 4 | 1 | 0 | DET | DI002 | 80 |
| fm_table_header | fm_label | fm_description | fm_effect | fm_area | fm_seq_area | permanant_fmd | transient_fmd | diagnostic_label | diagnostic_coverage |
| rfm_table_entry | FM1 | | | | | DI002 | 85 | DI002 | 80 |

AUTOMATION FOR FUNCTIONAL SAFETY DIAGNOSTIC COVERAGE

RELATED APPLICATION

This application claims priority under 35 U.S.C. § 119(e) to U.S. Provisional Patent Application No. 63/189,596, entitled "AUTOMATION FOR FUNCTIONAL SAFETY DIAGNOSTIC COVERAGE" filed on May 17, 2021, which application is incorporated herein by reference.

TECHNICAL FIELD

The present disclosure relates to Functional Safety (FuSa) information and specifically to automated techniques for determining functional safety diagnostic coverage (DC).

BACKGROUND

Integrated circuits (ICs) are fundamental components ubiquitously found in a wide variety of electronic devices, such as televisions, personal computers, mobile devices, and so on. An IC's design includes a wide variety of active components and interconnections, which can exhibit different types of failures. Functional Safety (FuSa) refers to the part of the overall safety of a system or equipment that depends on automatic protection operating correctly in response to its inputs and having predictable responses to failure. When implemented in the IC design process, functional safety concepts can provide quantification of the extent an IC design is covered by automatic protection, enabling system designers to assess the safety of an overall system implemented using various ICs.

SUMMARY

The present technology provides systems, methods and computer program instructions implementing an automated technology for conducting functional safety (FuSa) diagnostic coverage (DC) analysis. In implementations, electronic design automation (EDA) tools and techniques are configured to determine how much area is protected by a safety mechanism (SM) out of total area. Each failure mode (FM) can be comprised of single or group of output ports. Each output port can have single, multiple or no safety mechanism (SM) protection. Each SM can have different diagnostic capability. An FM logic cone can comprise safety protected and unprotected logic. The present technology employs back tracing a netlist to determine a total area and safety protected area (SPA) for each design output ports and failure modes. Based on such detailed analysis, a diagnostic coverage can be determined for each output for one or more failure modes.

In an aspect of the present technology a method for conducting functional safety diagnostic coverage includes receiving circuit design information including functional safety (FuSa) information for at least one FuSa block that corresponds to a portion of a digital circuit, the FuSa information including a set of failure modes (FM) defining potential wrong values of a signal indicting an external factor manifesting an error within the at least one FuSa block, and for each failure mode, output port (Out) association information for each FuSa block. The method can also include receiving an identification of internal safety protected signals (Ps) and a diagnostic coverage for the FuSa block. The method can further include performing, by a processor, back tracing of a plurality of possible paths for an output port (Out) of the FuSa block up to one or more of inputs (In) or endpoints (Ep) of the FuSa block for each failure mode of each safety protected signal (Ps) and a corresponding diagnostic coverage. Determining an area for each possible path is also part of the method. The area determined can include an area for at least one of the possible paths that reaches from an input to an output (InOut), or an endpoint to an output (EpOut). The method can further include determining, based on given input diagnostic coverage (DC) and area calculated for each of the plurality of possible paths, a diagnostic coverage for each output and failure mode of the FuSa block.

In another aspect of the present technology, responsive to determining that a possible path has a safety protection signal (Ps), the processor can perform splitting the possible path into a plurality of possible paths; and determining an area for possible paths reaching from an input to a safety protection signal (InPs), an endpoint to a safety protection signal (EpPs), and a safety protection signal to an output (PsOut).

In some implementations, failure modes are grouped according to an external factor e.g., temperature, vibration, magnetic fields, and so forth that can cause failure of a digital circuit.

In some implementations, a label indicating a diagnostic category e.g., parity error, error correcting code (ECC) assigned by a user to a failure mode is received.

In a further aspect of the present technology, failure mode and its output port association information is received as input provided by a designer, received as design information as part of a design, or a combination thereof.

In a yet further aspect of the present technology, internal safety protected signals (Ps) and a diagnostic coverage information is received as input provided by a designer, received as design information as part of a design, or a combination thereof.

In a still yet further aspect of the present technology, diagnostic coverage is received for each top-level inputs (In).

A system including one or more processors and memory accessible by the processors is also described. The memory can be loaded with computer instructions which can be executed on the processors. The computer instructions when executed on the processors can implement any of the above-mentioned operations. Computer program products, such as a non-transitory computer-readable recording medium having computer instructions recorded thereon, which can be executed by computer systems are also described herein.

Other aspects and advantages of the present technology can be seen on review of the drawings, the detailed description and the claims, which follow.

BRIEF DESCRIPTION OF THE DRAWINGS

FIG. 3A illustrates a flowchart depicting an example of determining safety protected area (SPA) for one or more failure modes by implementing the present technology.

FIG. 4A illustrates a flowchart depicting an example of determining one or more possible internal paths from a netlist by implementing the present technology.

FIG. 5 illustrates a flowchart depicting an example of an automated process for determining a safety protected area (SPA) for one or more possible internal paths by implementing the present technology.

FIG. 6A illustrates a flowchart depicting an example of an automated process for determining diagnostic coverage for the output port (Out1 DC) and failure mode diagnostic coverage (FM DC) from logic cone safety protected area (SPA) and logic cone area for each output port by implementing the present technology.

FIG. 6B illustrates an example in which an implementation of the present technology is used to determine a diagnostic coverage for a data path parity (DPP) protected path.

DETAILED DESCRIPTION

Figure 1:
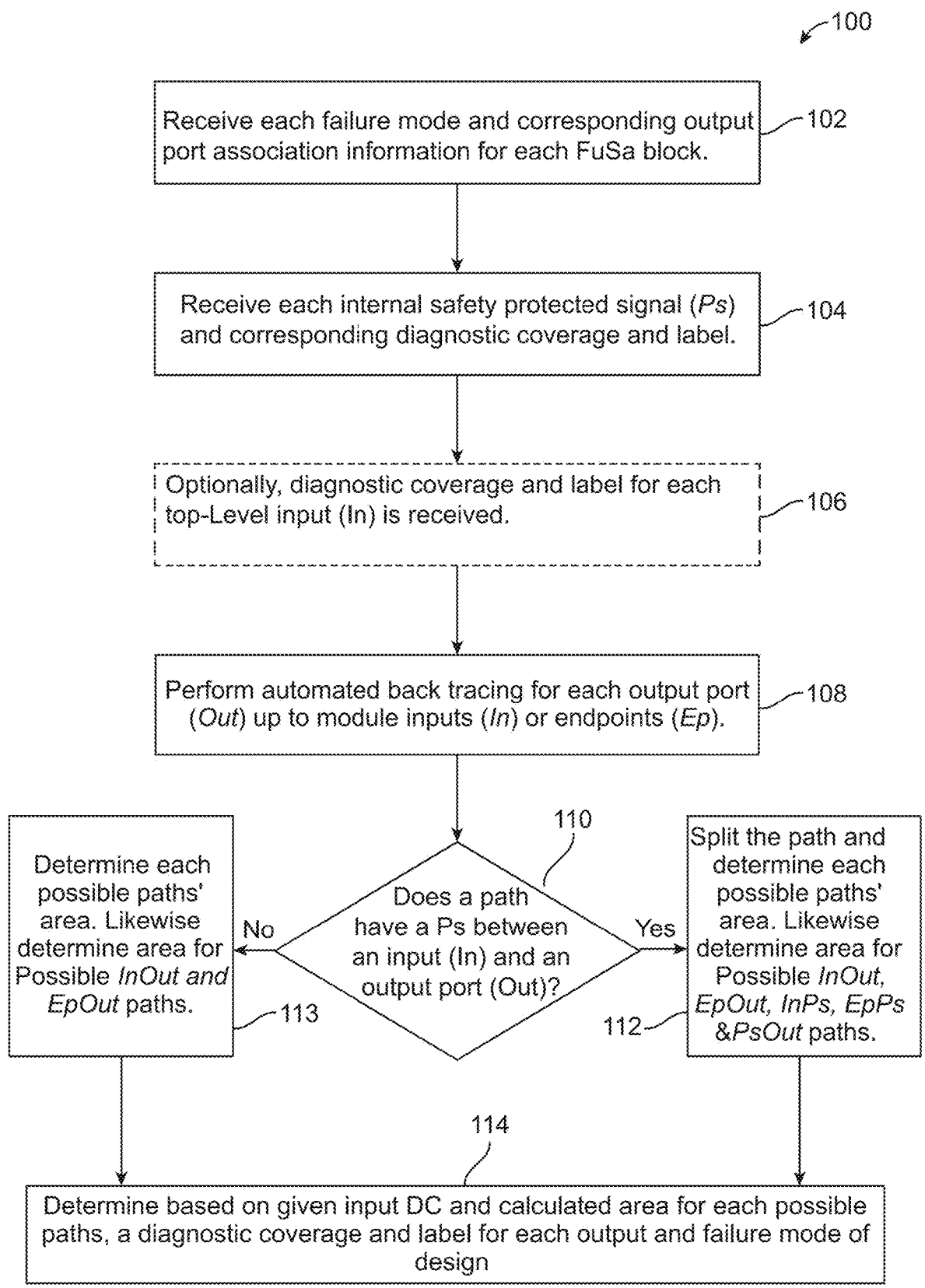
FIG. 1 illustrates a flowchart depicting an example process for determining diagnostic coverage for one or more failure modes by implementing the present technology.

Aspects of the present disclosure relate to functional safety (FuSa) diagnostic coverage (DC). Diagnostic coverage (DC) can be expressed as a percentage or as a number of hardware faults that can be detected by particular diagnostic(s) or safety mechanisms. Conducting functional safety (FuSa) assessments for a design can be challenging and can require detailed analysis of each of potentially many different failure modes (FMs). As used here, a failure mode refers to signals having a wrong value (e.g., an erroneous 0 or erroneous 1). Failure modes can be analyzed using a distribution of the probability of occurrence of the associated failure. Failure modes may be grouped according to different circumstances according to which the circuit can fail as a result of an external factor that causes the circuit failure. Some examples of failure modes include (i) for an output packet interface, an "internal failure leading to incorrect or no packet on the output packet interface," failure mode can be designated by ("pFM1") indicating packet interface failure mode number 1; and (ii) for an output control status register (CSR) interface, an "internal failure leading to incorrect or no status on the output CSR interface," failure mode can be designated by ("pFM2") indicating packet interface failure mode number 2. Some examples of an external factor can include temperature, vibration, magnetic fields, etc.

Techniques for assessing functional safety (FuSa) of a design present diverse challenges because such assessment requires detailed analysis of many different factors. Conventional techniques for manipulating functional safety (FuSa) information can be time intensive, laboriousness and error prone, can frequently involve a great deal of engineering judgement and can be highly subjective and difficult to justify. As such, these described detailed analyses are candidates for improved automated methods. Methods and systems described here provide a solution that enables automation to determine functional safety information. In some implementations, automation can be implemented using EDA tools/scripts.

The present technology includes a method to determine how much of a total circuit design is protected by safety mechanisms (SM), e.g., digital logic that is used to protect a circuit against a defined issue, such as overvoltage, overtemperature, and the like. As used here, area refers to gates in a particular portion of a logic circuit design implementation, which can be referred to as a total circuit design area. Thus, failure modes can be associated with a particular area of the circuit design. Implementations can quantify the area using metrics such as a transistor count, a count of gates, a count of circuit layers, and others.

Because failure modes are associated with signals having a wrong value (e.g., an erroneous 0 or an erroneous 1), each failure mode can include erroneous signal(s) in a single or a group of outputs, referred to here as output ports. Each output port can have single, multiple or no safety mechanism (SM) protection, which includes digital logic implementing protection against defined issues, e.g., overvoltage, overtemperature, or the like. Each SM can have a different diagnostic capability. A design verification tool, that illustrates for a typically large number of input signals converging via combinatorial logic to an output signal, or group of signals, is used, in the FM context, to define an FM logic cone that includes logic that is safety protected, e.g., by digital logic implementing actions to be taken in the event of a fault, as well as logic that is unprotected by an SM. The present technology employs back tracing a netlist using a verification tool such as for example and without limitation Verilog™ by Synopsys, Inc. to determine a total area and a safety protected area (SPA) for individual ones of the design output ports and the failure modes. Based on such detailed analysis, a diagnostic coverage (DC) can be determined for the failure modes.

As an input, a circuit designer can provide failure modes and output port association information for each FuSa block, internal safety protected signals (Ps) which are internal signals, upon which a safety mechanism is placed i.e., via user input to a circuit design, and diagnostic coverage and a label. As used herein, a safety protected signal can be a signal upon which safety related logic can be been implemented to protect circuit components and a user against a failure. In other words, a safety protected signal is a signal that can be and/or has been protected by a s safety mechanism and it can be a signal generated as a result of the failure. The safety related logic can perform one or more of: (i) a diagnosis of an error; (ii) an attempt to recover from a detected error; and (iii) a generation of signal indicating that an error has occurred. Thus, there can be many safety protection signals in a circuit design, wherein some safety protection signals can indicate or be related to a diagnosis of a failure, and other safety protection signals can be used to implement remedial action, and wherein safety protection signals can signal a user to warn or give diagnostic information.

For example, in an automotive context, some safety protection signals will detect a low battery voltage, some will shut down voltage-level sensitive equipment to protect from destruction, other signals will light a check engine light signaling to the driver something has failed, and still other signals will write appropriate error codes to an automotive diagnostic interface. Some implementations split diagnostics for a given output or failure mode. Since the output for the safety protection signal can be known, the logic can check if there is any safety component that is protected by that safety protection signal.

As used here, label refers to a diagnostic categorization that can be assigned to safety protection signal(s). These categories can be individual to a user and/or a user application. A user may provide a label to categorize the diagnostics, which can be proprietary to the user and can be part of a user's intellectual property (IP) block or integrated circuit (IC) design or hardware. For example, an implementation can define two (2) types of diagnostics, e.g., parity and error correcting code (ECC). An example list of diagnostic labels is discussed below with reference to FIG. 6B.

As used here, FuSa block refers to a portion of digital circuit or module. Optionally a designer can provide diagnostic coverage and label for each of the top-level inputs (In) e.g., the inputs to the FuSa block that do not originate at endpoints (Ep), which can be components within the FuSa block.

In implementations, automated approaches such as Verilog™ by Synopsys, Inc. can be used to trace-back paths within the netlist from each design output port (Out) to top-level inputs (In) to the logic circuitry of the FuSa block or endpoints (Ep) defining gates or other circuitry within the FuSa block that produce signals. As used here, paths or pathways refer to connections between output and input and intermediate logic.

If these paths have a safety protection signal (Ps) between input (In) and output port (Out), then Verilog™ will be used to split the path and determine areas for each of the possible paths. Implementations further include determining an area for possible paths, including paths between a top-level input to the FuSa block and output port of the FuSa block, i.e., an InOut path, paths between an endpoint within the FuSa block and an output port of the FuSa block, i.e., an EpOut path, paths between a top-level input to the FuSa block and a safety protection signal within the FuSa block, i.e., an InPs path, paths between an endpoint within the FuSa block and a safety protection signal within the FuSa block, i.e., an EpPs path, and paths between a safety protection signal within the FuSa block and an output port of the FuSa block, i.e., PsOut paths.

In implementations, based on input from a circuit designer or an EDA software program indicating a diagnostic coverage and a determined area for each possible path, the present technology can determine a diagnostic coverage and a label for each output and failure mode of design. The circuit designer or an EDA software program can indicate input diagnostic coverage information directly into software implementing the present technology or such input information can be input from a failure mode design or a FuSa aware register transfer level (RTL) design automation tool which models a synchronous digital circuit in terms of the flow of digital signals. In implementations, the present technology can perform computations of diagnostic coverage based upon failure modes and circuit design information input, thereby enabling results to be made available in a less time-intensive, laborious and error prone manner than conventional techniques.

FIG. 1 illustrates a flowchart depicting an example process for determining diagnostic coverage for one or more failure modes by implementing the present technology. In block 102, each failure mode and corresponding output port association information for each FuSa block is received. This information can be provided as input by a designer, received as design information as part of a design, or combinations thereof. Further, labels identifying diagnostic categories, can be assigned by the designer to the failure modes. The diagnostic categories (labels) can include parity error, error correcting code (ECC), etc. In block 104, each internal safety protected signal (Ps) and corresponding diagnostic coverage and label is received. For additional details on mechanisms for determining diagnostic coverage for safety protected signals, the skilled person can have reference to ISO26262 automotive standard. This information can be provided as input by a designer, received as design information as part of a design, or combinations thereof. In block 106, optionally, diagnostic coverage and label for each top-level input (In), is received. For additional details on mechanisms for determining diagnostic coverage for safety protected signals, the skilled person can have reference to ISO26262 automotive standard. This information can be provided as input by a designer, received as design information as part of a design, or combinations thereof. In block 108, automated back tracing using a verification tool such as for example and without limitation Verilog™ by Synopsys, Inc., or equivalent EDA tool is performed to trace signal paths through the logic for each output port (Out) to module inputs (In) or endpoints (Ep) within the circuit logic being analyzed. In block 110, if a path has a safety protection signal (Ps) between input (In) and output port (Out), then in block 112, Verilog™ can be used to (i) split the path; and (ii) determine areas for each of the possible paths. Areas can be determined for possible paths including, e.g., an InOut path between a top-level input and an output port, an EpOut path between an endpoint within the circuit and an output port, an InPs path between a top-level input and a safety protection signal, an EpPs path between an endpoint within the circuit and a safety protection signal, and a PsOut path between a safety protection signal and an output port of the logic circuit. If the paths do not have a safety protection signal (Ps) between the input (In) and the output port (Out) in block 110, then block 113 determines an area for each possible InOut paths and EpOut paths. In a block 114, a diagnostic coverage and a label are determined for each output and failure mode of the design based on given input DC and a calculated area for each possible path.

Figure 2A:
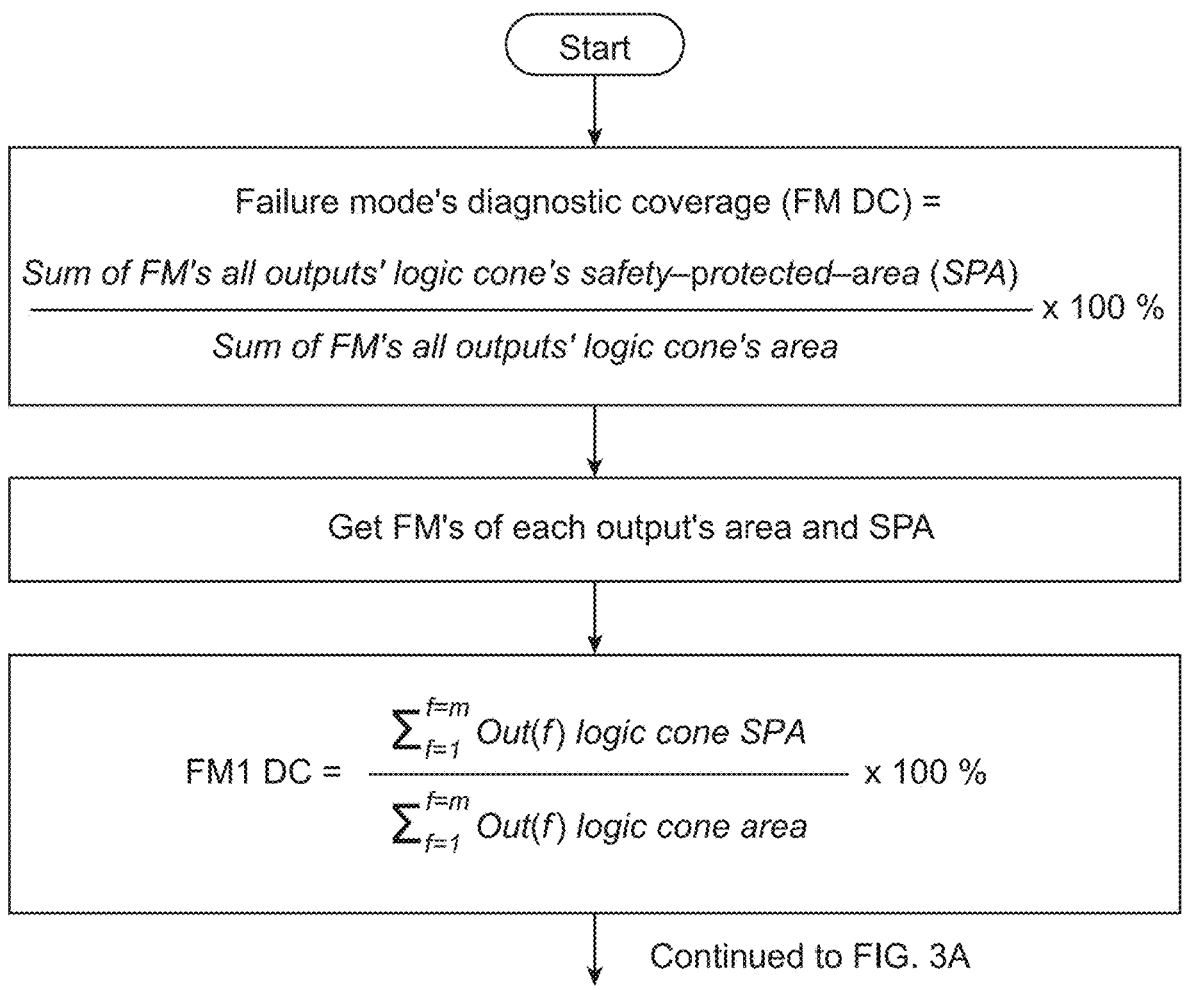
FIG. 2A illustrates a flowchart depicting an example of determining diagnostic coverage for one or more failure modes by implementing the present technology.
Figure 2B:
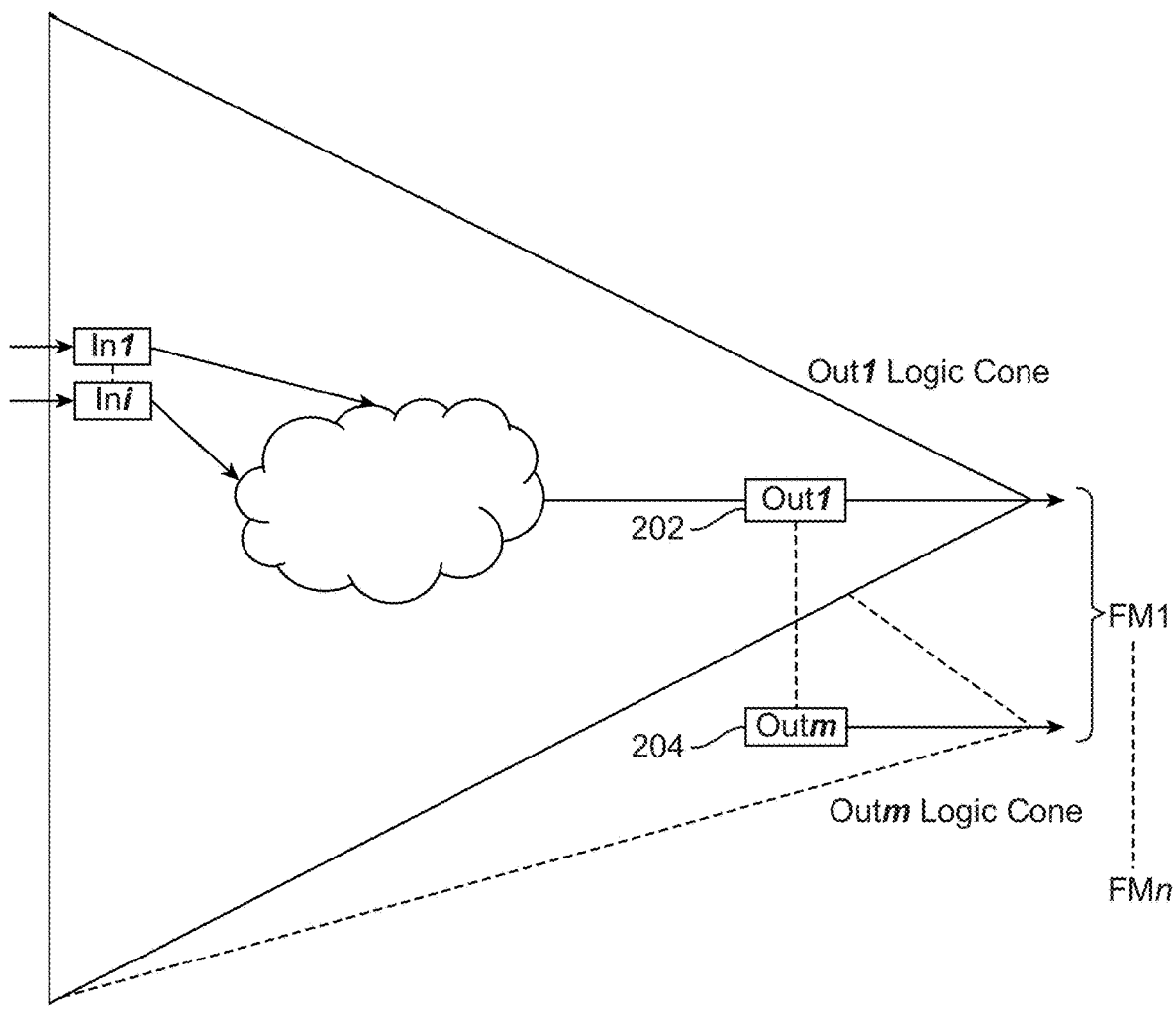
FIG. 2B illustrates an example of an output ports logic cone for a failure mode of FIG. 2A.

FIG. 2A illustrates a flowchart depicting an example of determining diagnostic coverage for one or more failure modes by implementing the present technology. FIG. 2B illustrates an example of an output port's logic cone for a failure mode of FIG. 2A. FIG. 2A illustrates a failure mode's diagnostic coverage (FM DC) is defined in equation (1) as:

$$FM\ DC = \frac{\text{Sum of } FM\text{'s all outputs' logic cone's safety-protected-area}(SPA)}{\text{Sum of } FM\text{'s all outputs' logic cone's area}} \times 100\% \quad (1)$$

In equation 1, the diagnostic coverage of all failure modes (FM DC) is obtained from a ratio of (i) a sum of all safety protected circuit areas for the safety protected circuitry of each output of each failure mode; and (ii) a sum of all circuit areas for the total circuit design, both safety protected circuitry and unprotected circuitry, of each output of each failure mode. FIG. 2B illustrates obtaining a circuit area and a safety protected area for the logic comprising logic cones associated with each output in a set of m outputs, Out1 to Outm, for each failure mode in a set of n failure modes, FM1 to FMn. These quantities can be determined from input information received for each of the outputs and each of the associated failure modes. As shown in FIG. 2B, outputs Out1 202 to Outm 204 are associated with failure mode FM1. Now with renewed reference to FIG. 2A, diagnostic coverage for an individual failure mode (FM1 DC) is defined in equation (2) as:

$$FM1\ DC = \frac{\sum_{f=1}^{f=m} \text{Out}(f)\ \text{logic cone } SPA}{\sum_{f=1}^{f=m} \text{Out}(f)\ \text{logic cone area}} \times 100\% \quad (2)$$

In equation 2, the diagnostic coverage of an individual failure mode (FM1 DC) is obtained from a ratio of (i) a sum of all safety protected circuit areas for the safety protected circuitry associated with each one of a set of m outputs, Out(f), from Out(f=1) to Out(f=m) for failure mode FM1; and (ii) a sum of all circuit areas for the circuitry within a logic cone, including both safety protected circuitry and unprotected circuitry, associated with each of the outputs, Out(f), from Out(f=1) to Out(f=m) for failure mode FM1.

Figure 3B:
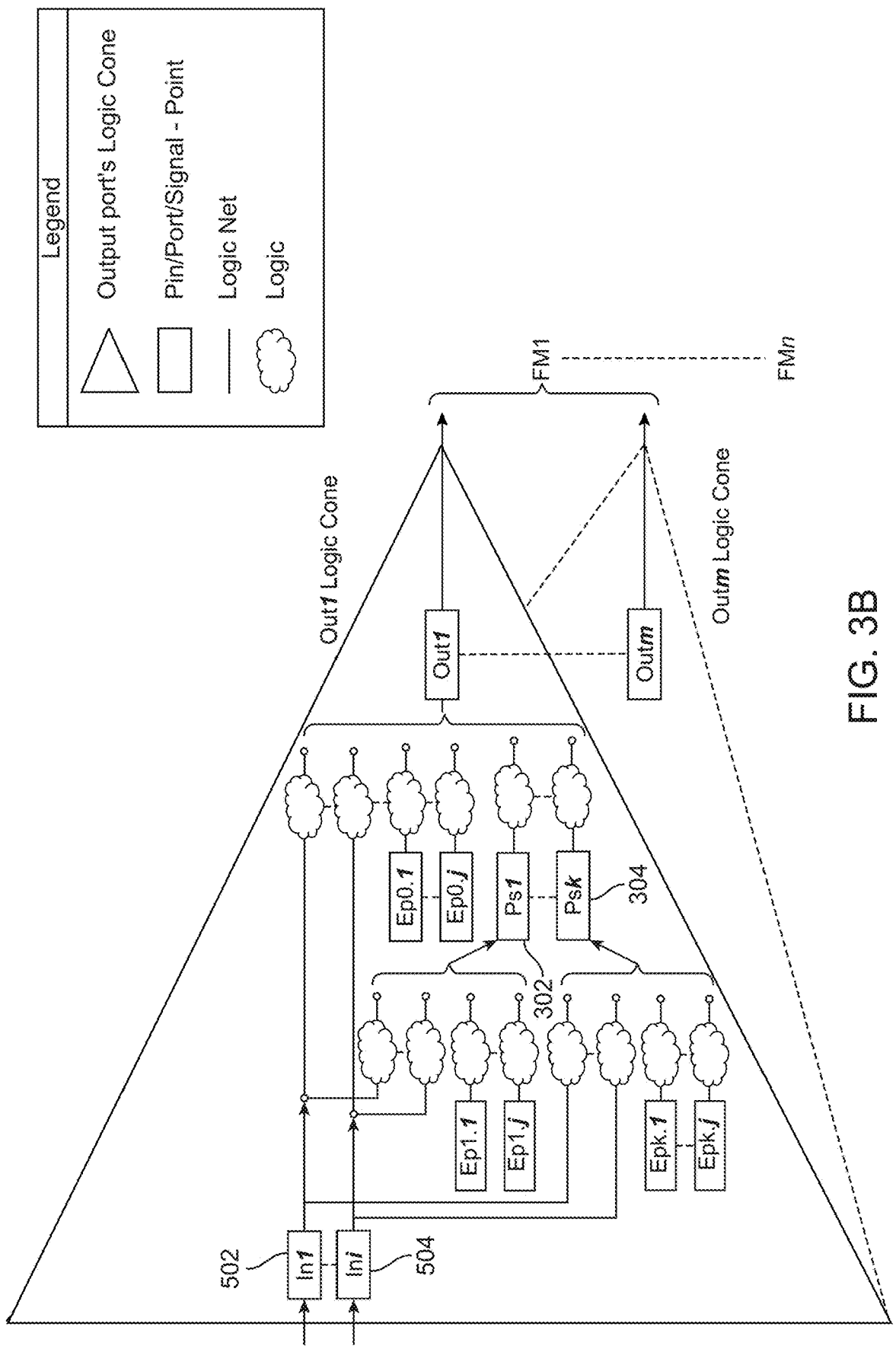
FIG. 3B illustrates an example of an output ports logic cone for FIG. 3A.

FIG. 3A illustrates a flowchart depicting an example of determining a safety protected area (SPA) for one or more failure modes by implementing the present technology. Specifically FIG. 3A illustrates the user providing protected signals' (PS) hierarchical paths, such as paths Ps1 to Psk, as illustrated in FIG. 3B. FIG. 3B illustrates an example of a logic cone for an output port for the process illustrated in FIG. 3A. As depicted in FIG. 3B, hierarchical paths, 302, 304, e.g., Ps1 to Psk. for internal safety protected signal(s) are received. With continued reference to FIG. 3B and as also illustrated in FIG. 3A, based on the input received, possible internal paths within the logic cone are automatically categorized in accordance with the following:

In—Input port
Ep—unprotected internal endpoint signal
Ps—safety protected internal signal, on which safety mechanism is placed (user input)
Out—Output port FIGS. 3A and 3B further illustrate that Out(f) logic cone area, is determined from summing areas of the possible internal paths determined for the circuitry encompassed by the logic cone for a particular output Out(f) as defined in equation (3) as:

Out(f) logic cone area=Sum of areas of the possible internal paths (3)

Figure 4B:
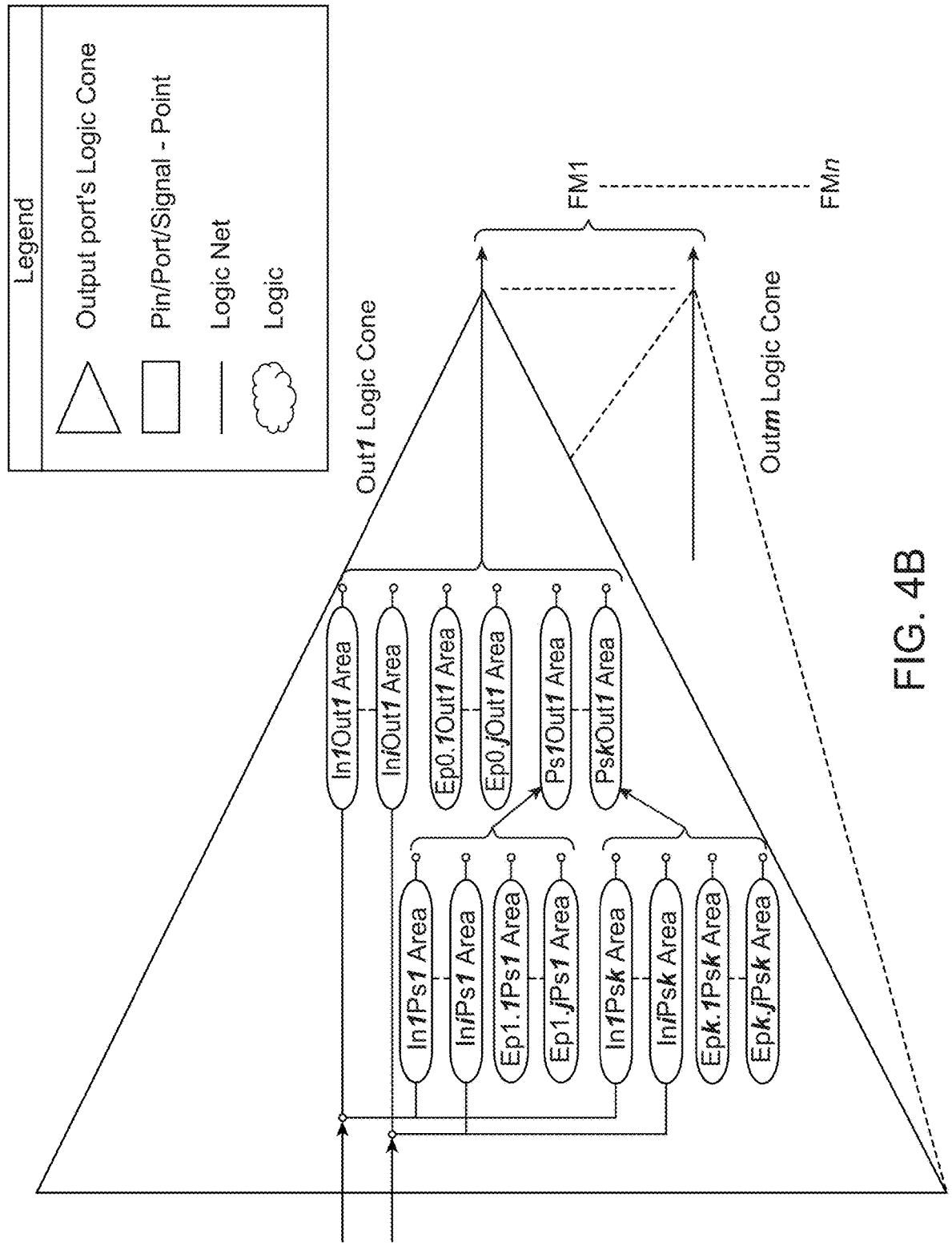
FIG. 4B illustrates an example of an output ports logic cone for FIG. 4A.

FIG. 4A illustrates a flowchart depicting an example of an automated process for determining one or more possible internal paths from a netlist using back tracing by implementing the present technology. FIG. 4B illustrates an example of a logic cone for the output port depicted in FIG. 4A. As depicted in FIGS. 4A and 4B, the processor determines areas for possible internal paths by back tracing netlist and selecting an appropriate category. For example, InOut—Input to Output Path, where no safety Protected signals are present
EpOut—Endpoint to Output path, where no safety Protected signals are present
InPs—Input to safety Protected signal path
EpPs—Endpoint to safety Protected signal path
PsOut—safety Protected signal to Output path Further, as shown in FIG. 4A, the total area for a logic cone defined for logic circuitry that produces output Out1 is determined by summing areas of all possible internal paths as shown by equation (4):

$$\text{Out1 logic cone area} = \sum_{f=1}^{f=i} In(f)\text{Out1Area} + \quad (4)$$

$$\sum_{f=1}^{f=j} Ep0 \cdot (f)\text{Out1Area} + \sum_{g=1}^{g=k}\left(\sum_{f=1}^{f=i} (In(f)Ps(g)\text{Area}) + \right.$$

-continued $$\left. \sum_{f=1}^{f=j}(Ep(g)\cdot(f)Ps(g)\text{Area}) + Ps(g)\text{Out1Area}\right)$$

In equation 4, the area of a logic cone associated with circuitry that produces output signal Out1 is given by the sum of (i) a first circuitry area determined for a set of paths from a set of i top-level inputs In(f), enumerated as In(f=1) to In(f=i) to a single output Out1; (ii) a second circuitry area determined for a set of paths from a set of j endpoints Ep0(f), enumerated as Ep0(f=1) to Ep0(f=j) to the single output Out1; (iii) a third circuitry area determined for a set of paths from a set of top-level inputs In(f), enumerated as In(f=1) to In(f=i) to a set of k safety protection circuits Ps(g), enumerated as Ps(g=1) to Ps(g=k); (iv) a fourth circuitry area determined for a set of paths from a set of j endpoints for the set of k safety protection circuits Ep(g)·(f), enumerated as Ep(g=1) to Ep(g=k) and (f=1) to (f=j) to the set of k safety protection circuits Ps(g), enumerated as Ps(g=1) to Ps(g=k); and (v) a fifth circuitry area determine for a set of paths from the set of k safety protection circuits Ps(g), enumerated as Ps(g=1) to Ps(g=k) to the single output Out1.

FIG. 5 illustrates a flowchart depicting an example of an automated process for determining a safety protected area (SPA) for one or more possible internal paths in accordance with the present technology. As depicted in FIGS. 5 and 4B, the processor executes instructions to determine the safety protected area (SPA) for each internal path based in part upon information received from the designer that provides diagnostic capability (DC) for the following: (i) diagnostic capability (DC) for protected signals (Ps) 302-304, which can be determined according to the ISO26262 standard. In some embodiments, a user can provide a diagnostic label to categorize the diagnostics, which can be proprietary to the user and can be part of a user's intellectual property (IP) block or integrated circuit (IC) design or hardware. For example, an implementation can define two (2) types of diagnostics, e.g., parity and error correcting code (ECC). Also provided are. (ii) diagnostic capability for the top-level input ports 502-504, which can be determined according to ISO26262 standard, and a label or labels for the input ports, if known. Such top-level input port definitions can be proprietary to the user and can be part of a user's intellectual property (IP) block or integrated circuit (IC) design or hardware.

In some embodiments, the diagnostic capability of an internal input ports may be inferred from a connected driver. For example, if the design includes an arithmetic logic unit (ALU) that has a random hardware failure and generates an out-of-range result, the next range check logic circuitry detects this. Therefore it can be inferred that the internal input connected to the ALU has the diagnostic capability to diagnose this error.

Further, as shown in FIG. 5, the logic cone safety protected area (SPA) for output Out1 is determined by eq. (5) as:

$$\text{Out1 logic cone } SPA = \sum_{f=1}^{f=i} In(f)Out1Area * In(f)DC + \quad (5)$$

$$\sum_{f=1}^{f=j} Ep0\cdot(f)Out1Area*0 + \sum_{g=1}^{g=k}\left(\sum_{f=1}^{f=i}(In(f)Ps(g)Area*In(f)DC) + \right.$$

-continued $$\sum_{f=1}^{f=j}(Ep(g) \cdot (f)Ps(g)Area * 0) + Ps(g)Out1Area * Ps(g)DC)$$

In equation 5, the safety protected area of a logic cone associated with circuitry that produces output signal Out1 is given by the sum of (i) a first circuitry safety protected area determined for a set of paths from a set of i top-level inputs In(f), enumerated as In(f=1) to In(f=i) to a single output Out1 and the associated diagnostic coverage In(f)DC; (ii) a second circuitry safety protected area determined for a set of paths from a set of j endpoints Ep0(f), enumerated as Ep0(f=1) to Ep0(f=j) to the single output Out1 and the associated diagnostic coverage, zero because these terms refer to endpoints that were either split from paths connecting to a top-level input due to the presence of a safety protection signal in step 112, and/or originate within the FuSa block (EP to out), thus these terms have no values for DC input by the design; (iii) a third circuitry safety protected area determined for a set of paths from a set of top-level inputs In(f), enumerated as In(f=1) to In(f=i) to a set of k safety protection circuits Ps(g), enumerated as Ps(g=1) to Ps(g=k) and the associated diagnostic coverage In(f)DC; (iv) a fourth circuitry safety protected area determined for a set of paths from a set of j endpoints for the set of k safety protection circuits Ep(g)·(f), enumerated as Ep(g=1) to Ep(g=k) and (f=1) to (f=j) to the set of k safety protection circuits Ps(g), enumerated as Ps(g=1) to Ps(g=k) and the associated diagnostic coverage, zero because these terms refer to endpoints that were either split from paths connecting to a top-level input due to the presence of a safety protection signal in step 112, and/or originate within the FuSa block (EP to out), thus these terms have no values for DC input by the design; and (v) a fifth circuitry safety protected area determined for a set of paths from the set of k safety protection circuits Ps(g), enumerated as Ps(g=1) to Ps(g=k) to the single output Out1 and the associated diagnostic coverage, Ps(g)DC.

FIG. 6A illustrates a flowchart depicting an example of an automated process for determining diagnostic coverage for the output port (Out1 DC) and failure mode diagnostic coverage (FM DC) from logic cone safety protected area (SPA) and logic cone area for each output port by implementing the present technology. As shown in FIG. 6A, Out1 DC and FM1 DC are determined by equations (6) and (7) as:

$$Out1\ DC = \frac{Out1\ \text{logic cone } SPA}{Out1\ \text{logic cone area}} \times 100\% \quad (6)$$

In equation 6, the diagnostic coverage of output out1 (Out1 DC) is obtained from a ratio of (i) a safety protected circuit area for the safety protected circuitry of output Out1 computed above using equation (5); and (ii) a total circuit area for the circuit design enclosed by the logic cone of output Out1 computed above using equation (4), which includes both safety protected circuitry and unprotected circuitry, as illustrated by equation (7):

$$FM1\ DC = \frac{\sum_{f=1}^{f=m} Out(f)\ \text{Logic Cone } SPA}{\sum_{f=1}^{f=m} Out(f)\ \text{Logic Cone Area}} \times 100\% \quad (7)$$

In equation 7, the diagnostic coverage of an individual failure mode (FM1 DC) is obtained from a ratio of (i) a sum of all safety protected circuit areas for the safety protected circuitry associated with each of the outputs, Out(f), from Out(f=1) to Out(fem) for failure mode FM1; and (ii) a sum of all circuit areas for the circuitry depicted in a logic cone, both safety protected circuitry and unprotected circuitry, associated with each of the outputs, Out(f), from Out(f=1) to Out(f=m) for failure mode FM1.

FIG. 6B illustrates an example in which an implementation of the present technology is used to determine diagnostic coverage for a data path parity (DPP) protected path, i.e., a path carrying data that is parity checked by parity checking logic, (PsA to PsC). With continued reference to FIG. 6B, In is an input port, Ps is a safety protected internal signal, on which a safety mechanism is placed and Out is an output port. With reference to input table 602, the user provides as input parameters including: (i) InA (also called InTop in table 602) having a value of 0% for DC entered into diagnostic_coverage column; indicating for example, a top level input that is not protected external to the circuit design; (ii) PsA DC=90%; indicating DG1 onward has diagnostic capability providing diagnostic coverage and PsA Label=DI002; a diagnostic label assigned by the user to indicate category information or other information that can be part of an IP block or IC chip and/or otherwise proprietary to a circuit designer user; and (iii) PsC DC=0%; indicating that data on path PsC is parity checked by data path parity (DPP) checking logic implemented, where data path parity protection ends. Additionally, the user provides output to FM association for each block as described in table 603, as illustrated in FIG. 6B.

The present technology further provides DC for outputs OutA, OutB, OutC and failure modes that internally will, (i) run for block A and generate diagnostic coverage for output A (OutA DC); (ii) use as the diagnostic coverage for input to block B (InB DC) the diagnostic coverage determined for output A (OutA DC) and run for block B to generate an output diagnostic coverage for output B (OutB DC); and (iii) use as the diagnostic coverage for input to block C (InC DC) the diagnostic coverage determined for output B (OutB DC) and run for block C and generate diagnostic coverage for output C (OutC DC). Thus, the present technology generates DC for outputs OutA, OutB, OutC for the failure modes and provides associated diagnostic labels (see table 604 in FIG. 6B). The generated DC and associated diagnostic labels can be used for failure modes effects and diagnostics analysis (FMEDA), safety critical Analysis (SCA), and other FuSa work product. As an example, for safety critical analysis, if an output is safety relevant, i.e., a failure can cause a hazard to person or property, and it is not part of SM logic, then if the calculated diagnostic coverage is greater than zero (DC>0), the output is classified as detected (DET). However, if calculated diagnostic coverage (DC) is equal to zero (DC=0), then the output is classified as potential to violate a safety goal (PVSG), i.e., an "unsafe" fault. Whether an output is safety relevant, i.e., can cause a hazard to person or property, or it is part of safety mechanism logic, can be classified by a circuit designer or other skilled user or FuSa aware RTL. For safety irrelevant output, i.e., cannot cause a hazard to person or property, the output can be classified as no potential to violate a safety goal (NO_PVSG), i.e., a "safe" fault. For safety mechanism logic output, the output can be classified as safety mechanism latent (SM_LATENT) indicating that this is a latent fault under ISO 26262 that is associated with a safety mechanism.

Figure 7:
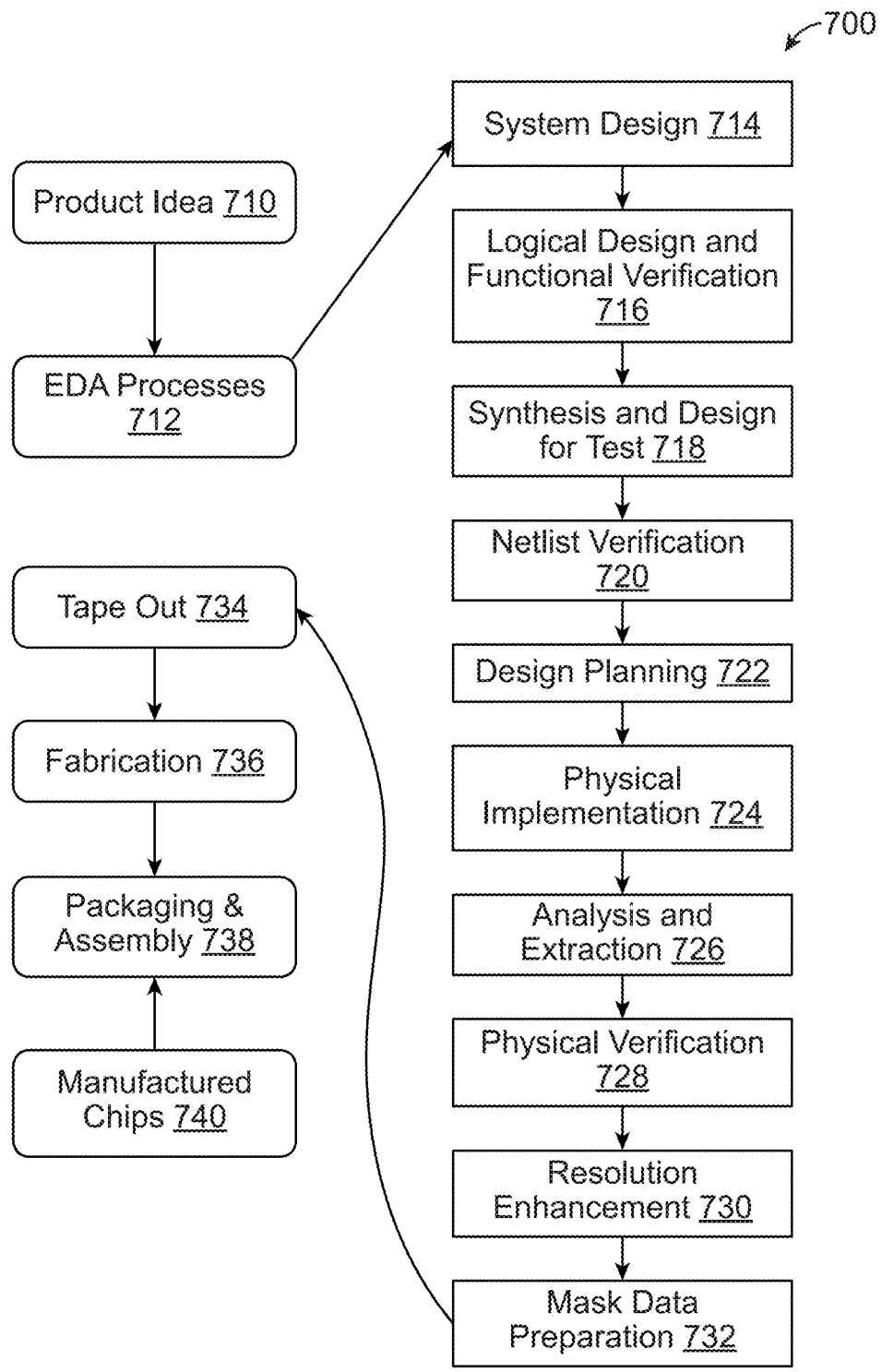
FIG. 7 depicts a flowchart of various processes used during the design and manufacture of an integrated circuit in accordance with some embodiments of the present disclosure.

FIG. 7 illustrates an example set of processes 700 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 710 with information supplied by a designer, information which is transformed to create an article of manufacture that uses a set of EDA processes 712. When the design is finalized, the design is taped-out 734, which is when artwork (e.g., geometric patterns) for the integrated circuit is sent to a fabrication facility to manufacture the mask set, which is then used to manufacture the integrated circuit. After tape-out, a semiconductor die is fabricated 736 and packaging and assembly processes 738 are performed to produce the finished integrated circuit 740.

Specifications for a circuit or electronic structure may range from low-level transistor material layouts to high-level description languages. A high-level of modelling may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower level of modelling adds more useful detail into the design description, for example, more details for the modules, including processors and executable code that include the description. The lower levels of the model can be generated by a computer, derived from a design library, or created by another design automation process. An example of a specification language at a lower level of modelling or design language for specifying more detailed descriptions is SPICE, which is used for detailed descriptions of circuits with many analog components. Descriptions at each level of modelling are enabled for use by the corresponding tools of that layer (e.g., a formal verification tool). A design process may use a sequence depicted in FIG. 7. The processes described by be enabled by EDA products (or tools).

During system design 714, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 716, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 718, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 720, the netlist is checked for compliance with timing constraints and for correspondence with the HDL code. During design planning 722, an overall floor plan for the integrated circuit is constructed and analyzed for timing and top-level routing.

During layout or physical implementation 724, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 726, the circuit function is verified at the layout level, which permits refinement of the layout design. During physical verification 728, the layout design is checked to ensure that manufacturing constraints are correct, such as DRC constraints, electrical constraints, lithographic constraints, and that circuitry function matches the HDL design specification. During resolution enhancement 730, the geometry of the layout is transformed to improve how the circuit design is manufactured.

During tape-out, data is created to be used (after lithographic enhancements are applied if appropriate) for production of lithography masks. During mask data preparation 732, the 'tape-out' data is used to produce lithography masks that are used to produce finished integrated circuits.

A storage subsystem of a computer system (such as computer system 900 of FIG. 8) may be used to store the programs and data structures that are used by some or all of the EDA products described herein, and products used for development of cells for the library and for physical and logical design that use the library.

Figure 8:
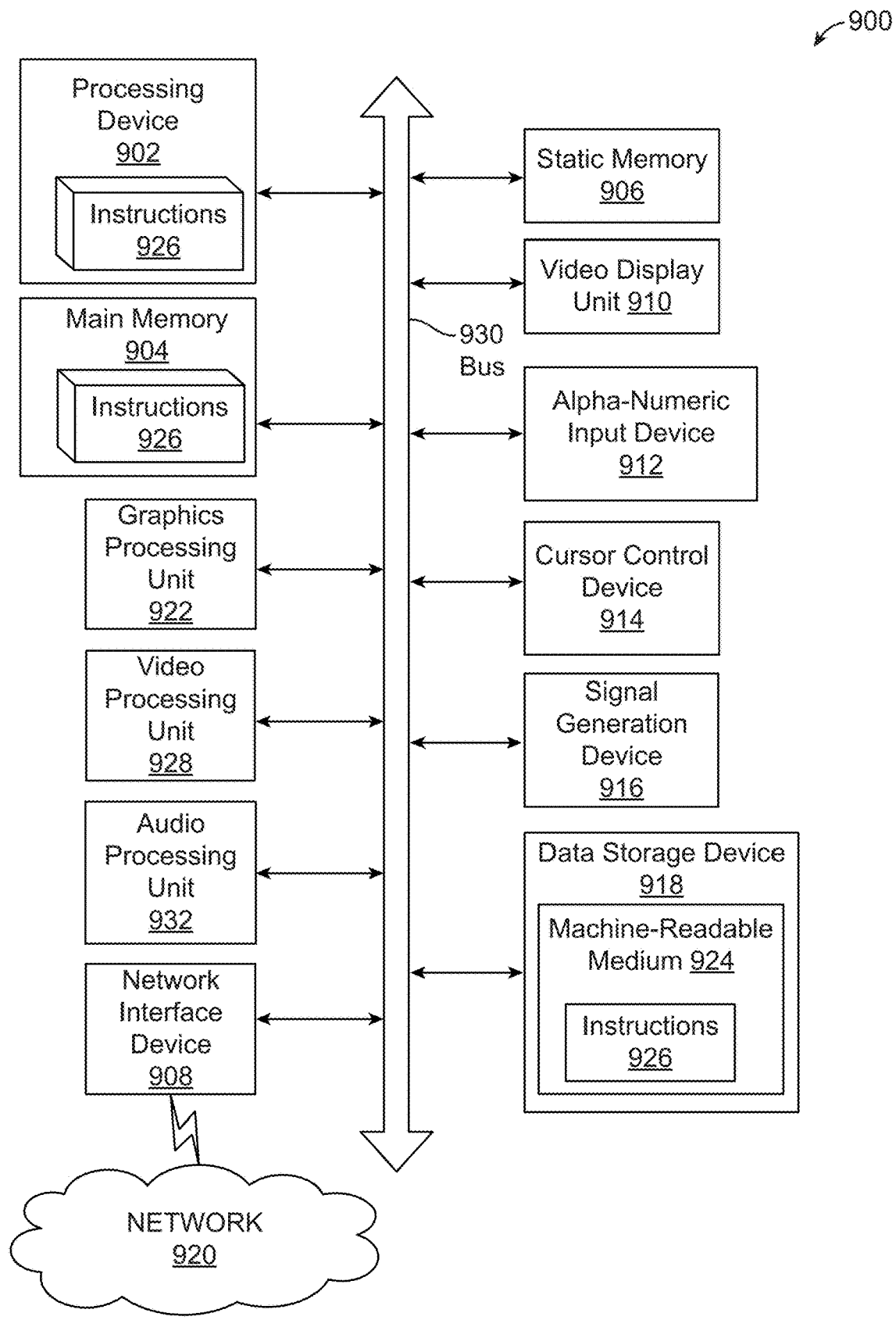
FIG. 8 depicts a diagram of an example computer system in which embodiments of the present disclosure may operate.

FIG. 8 illustrates an example machine of a computer system 900 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM), a static memory 906 (e.g., flash memory, static random access memory (SRAM), etc.), and a data storage device 918, which communicate with each other via a bus 930.

Processing device 902 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 may also be one or more special-purpose processing devices such as an application specific integrated circuit (ASIC), a field programmable gate array (FPGA), a digital signal processor (DSP), network processor, or the like. The processing device 902 may be configured to execute instructions 926 for performing the operations and steps described herein.

The computer system 900 may further include a network interface device 908 to communicate over the network 920. The computer system 900 also may include a video display unit 910 (e.g., a liquid crystal display (LCD) or a cathode ray tube (CRT)), an alphanumeric input device 912 (e.g., a keyboard), a cursor control device 914 (e.g., a mouse), a graphics processing unit 922, a signal generation device 916 (e.g., a speaker), graphics processing unit 922, video processing unit 928, and audio processing unit 932.

The data storage device 918 may include a machine-readable storage medium 924 (also known as a non-transitory computer-readable medium) on which is stored one or more sets of instructions 926 or software embodying any one or more of the methodologies or functions described herein. The instructions 926 may also reside, completely or at least partially, within the main memory 904 and/or within the processing device 902 during execution thereof by the computer system 900, the main memory 904 and the processing device 902 also constituting machine-readable storage media.

In some implementations, the instructions 926 include instructions to implement functionality corresponding to the present disclosure. While the machine-readable storage medium 924 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 902 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method comprising:
receiving circuit design information including functional safety (FuSa) information for at least one FuSa block that corresponds to a portion of a digital circuit, the FuSa information including a set of failure modes (FM) defining potential wrong values of a signal indicting an external factor manifesting an error within the at least one FuSa block, and for each failure mode, output port (Out) association information for each FuSa block;
receiving an identification of internal safety protected signals (Ps) and a diagnostic coverage for the FuSa block;
performing, by a processor, back tracing of a plurality of possible paths for an output port (Out) of the FuSa block up to one or more of inputs (In) or endpoints (Ep) of the FuSa block for each failure mode of each safety protected signal (Ps) and a corresponding diagnostic coverage;
determining an area for each possible path, including an area for at least one of the possible paths that reaches from an input to an output (InOut), or an endpoint to an output (EpOut); and
determining, based on given input diagnostic coverage (DC) and area calculated for each of the plurality of possible paths, a diagnostic coverage for each output and failure mode of the FuSa block.

2. The method of claim 1, further including responsive to determining that a possible path has a safety protection signal (Ps), performing by the processor:
splitting the possible path into a plurality of possible paths; and
determining an area for possible paths reaching from an input to a safety protection signal (InPs), an endpoint to a safety protection signal (EpPs), and a safety protection signal to an output (PsOut).

3. The method of claim 1, wherein failure modes are grouped according to an external factor that causes digital circuit failure.

4. The method of claim 1, further including receiving an input comprising a label indicating a diagnostic category assigned by a user to a failure mode.

5. The method of claim 1, wherein failure mode and its output port association information is received as input provided by a designer, received as design information as part of a design, or a combination thereof.

6. The method of claim 1, wherein internal safety protected signals (Ps) and a diagnostic coverage information is received as input provided by a designer, received as design information as part of a design, or a combination thereof.

7. The method of claim 1, further including receiving diagnostic coverage for each top-level inputs (In).

8. A system comprising:
a memory storing instructions; and
a processor, coupled with the memory and to execute the instructions, the instructions when executed cause the processor to perform:
receiving circuit design information including functional safety (FuSa) information for at least one FuSa block that corresponds to a portion of a digital circuit, the FuSa information including a set of failure modes (FM) defining potential wrong values of a signal indicting an external factor manifesting an error within the at least one FuSa block, and for each failure mode, output port (Out) association information for each FuSa block;
receiving an identification of internal safety protected signals (Ps) and a diagnostic coverage for the FuSa block;
performing by a processor, back tracing of a plurality of possible paths for an output port (Out) of the FuSa block up to one or more of inputs (In) or endpoints (Ep) of the FuSa block for each failure mode of each safety protected signal (Ps) and a corresponding diagnostic coverage;
determining an area for each possible path, including an area for at least one of the possible paths that reaches from an input to an output (InOut), or an endpoint to an output (EpOut); and
determining, based on given input diagnostic coverage (DC) and area calculated for each of the plurality of possible paths, a diagnostic coverage for each output and failure mode of the FuSa block.

9. The system of claim 8, further including responsive to determining that a possible path has a safety protection signal (Ps), performing by the processor:
splitting the possible path into a plurality of possible paths; and
determining an area for possible paths reaching from an input to a safety protection signal (InPs), an endpoint to a safety protection signal (EpPs), and a safety protection signal to an output (PsOut).

10. The system of claim 8, wherein failure modes are grouped according to an external factor that causes digital circuit failure.

11. The system of claim 8, further including receiving an input comprising a label indicating a diagnostic category assigned by a user to a failure mode.

12. The system of claim 8, wherein failure mode and its output port association information is received as input provided by a designer, received as design information as part of a design, or a combination thereof.

13. The system of claim 8, wherein internal safety protected signals (Ps) and a diagnostic coverage information is received as input provided by a designer, received as design information as part of a design, or a combination thereof.

14. The system of claim 8, further including receiving diagnostic coverage for each top-level inputs (In).

15. A non-transitory computer readable medium comprising stored instructions, which when executed by a processor, cause the processor to perform:
receiving circuit design information including functional safety (FuSa) information for at least one FuSa block that corresponds to a portion of a digital circuit, the FuSa information including a set of failure modes (FM) defining potential wrong values of a signal indicting an external factor manifesting an error within the at least one FuSa block, and for each failure mode, output port (Out) association information for each FuSa block;
receiving an identification of internal safety protected signals (Ps) and a diagnostic coverage for the FuSa block;
performing by a processor, back tracing of a plurality of possible paths for an output port (Out) of the FuSa block up to one or more of inputs (In) or endpoints (Ep) of the FuSa block for each failure mode of each safety protected signal (Ps) and a corresponding diagnostic coverage;
determining an area for each possible path, including an area for at least one of the possible paths that reaches from an input to an output (InOut), or an endpoint to an output (EpOut); and determining, based on given input diagnostic coverage (DC) and area calculated for each of the plurality of possible paths, a diagnostic coverage for each output and failure mode of the FuSa block.

16. The non-transitory computer readable medium of claim 15, further including responsive to determining that a possible path has a safety protection signal (Ps), instructions for performing:
   splitting the possible path into a plurality of possible paths; and
   determining an area for possible paths reaching from an input to a safety protection signal (InPs), an endpoint to a safety protection signal (EpPs), and a safety protection signal to an output (PsOut).

17. The non-transitory computer readable medium of claim 15, wherein failure modes are grouped according to an external factor that causes digital circuit failure.

18. The non-transitory computer readable medium of claim 15, further including instructions for receiving an input comprising a label indicating a diagnostic category assigned by a user to a failure mode.

19. The non-transitory computer readable medium of claim 15, wherein failure mode and its output port association information is received as input provided by a designer, received as design information as part of a design, or a combination thereof.

20. The non-transitory computer readable medium of claim 15, wherein internal safety protected signals (Ps) and a diagnostic coverage information is received as input provided by a designer, received as design information as part of a design, or a combination thereof.

* * * * *